United States Patent
Kasperkovitz

(10) Patent No.: US 7,155,186 B2
(45) Date of Patent: Dec. 26, 2006

(54) AM RECEIVER WITH CONTROLLABLE RF INPUT CIRCUIT

(75) Inventor: Wolfdietrich Georg Kasperkovitz, Waalre (NL)

(73) Assignee: Semiconductor Ideas to Market (ITOM) B.V., Breda (NL)

(*) Notice: Subject to any disclaimer, the term of this patent is extended or adjusted under 35 U.S.C. 154(b) by 451 days.

(21) Appl. No.: 10/470,471

(22) PCT Filed: Feb. 4, 2002

(86) PCT No.: PCT/EP02/01247

§ 371 (c)(1),
(2), (4) Date: Jul. 28, 2003

(87) PCT Pub. No.: WO02/063784

PCT Pub. Date: Aug. 15, 2002

(65) Prior Publication Data

US 2004/0097208 A1  May 20, 2004

(30) Foreign Application Priority Data

Feb. 8, 2001  (EP) ................... 01200458

(51) Int. Cl.
*H04B 1/06* (2006.01)

(52) U.S. Cl. .................. 455/234.1; 455/182.1; 455/186; 455/230

(58) Field of Classification Search ............. 455/136, 455/138, 142, 139, 192.1, 234.2, 186, 182.1, 455/230, 234.1
See application file for complete search history.

(56) References Cited

U.S. PATENT DOCUMENTS

| | | | |
|---|---|---|---|
| 5,041,793 A | | 8/1991 | Gailus |
| 5,220,686 A | * | 6/1993 | Kasperkovitz et al. ... 455/234.1 |
| 5,270,916 A | | 12/1993 | Sexton et al. |
| 5,417,221 A | | 5/1995 | Sickler |

* cited by examiner

*Primary Examiner*—Duc Nguyen
*Assistant Examiner*—Eric J Elcenko
(74) *Attorney, Agent, or Firm*—Robert M McDermott, Esq.

(57) ABSTRACT

AM receiver comprising an RF input circuit for receiving an RF AM signal, demodulation means providing an audio signal carried by said RF AM signal as well as automatic gain control means for stabilising an RF carrier dependent DC level at the output of said demodulation means at a substantially fixed stabilisation value. In order to improve the receiver performance in particular at low values of the RF reception fieldstrength, the RF input circuit is being provided with a cascade of N tuneable resonance amplifiers being tuned to said RF AM signal, said automatic gain control means controlling at least one of said cascade of N resonance amplifiers to increase in both gain and selectivity at a decrease of the fieldstrength of said RF input signal.

16 Claims, 2 Drawing Sheets

AM RECEIVER WITH CONTROLLABLE RF INPUT CIRCUIT

Figure 1:
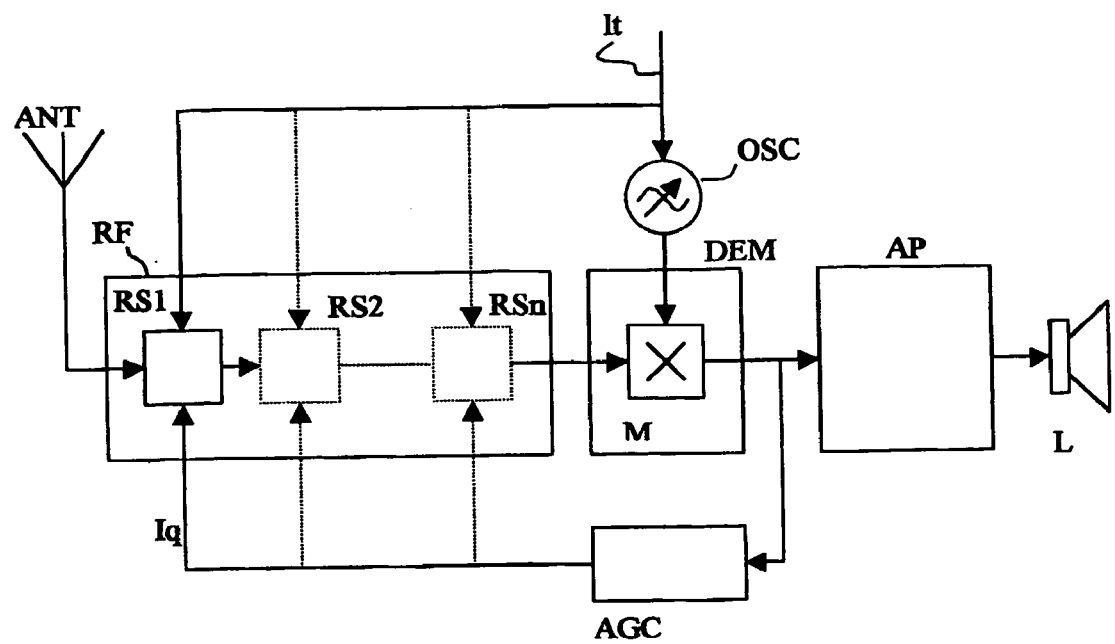

The invention relates to an AM receiver comprising an RF input circuit for receiving an RF AM signal, demodulation means providing an audio signal carried by said RF AM signal as well as automatic gain control means for stabilising an RF carrier dependent DC level at the output of said demodulation means at a substantially fixed stabilisation value. Such receivers are widely known in both direct receiving and superheterodyne concept. An example for the latter concept is given in Philips' Application Note of Philips' one chip AM radio IC TEA 5551T dated October 1990.

In demodulating the baseband audio modulation signal the demodulation means of said known receivers also rectify the RF AM carrier signal into a DC level. Being a reference for the fieldstrength of the received RF AM signal—or RF reception fieldstrength—this DC level is used in said AGC means to stabilise the amplitude of the demodulated audiosignal against variations in the RF reception fieldstrength. The AGC means therefore increases the receiver gain at a decrease of the actual DC level from said fixed stabilisation level and vice versa, such that said DC level is being stabilised at said fixed stabilisation level. This automatic receiver gain control is chosen to be effective for the range of RF reception fieldstrength values offering acceptable signal reproduction. As known, the noise level of the RF AM signal increases as the RF reception fieldstrength decreases. Down to a certain value of the RF reception fieldstrength, the noise level remains acceptable. However, an RF reception fieldstrength decreasing below this value causes sharp reduction of the signal to noise ratio to occur. There, the AGC means reaches the upper end of its gain control range by allowing the above DC level at the output of the demodulation to decrease from said stabilisation level as the RF reception fieldstrength further decreases. This, however, also reduces the amplitude of the useful audiosignal and therewith the intelligibility thereof.

It is an object of the invention to extend the range of RF reception fieldstrength values offering acceptable signal reproduction for low values of the RF signal reception fieldstrength.

An AM receiver comprising an RF input circuit for receiving an RF AM signal, demodulation means providing an audio signal carried by said RF AM signal as well as automatic gain control means for stabilising an RF carrier dependent DC level at the output of said demodulation means at a substantially fixed stabilisation value for RF AM signals having an RF reception fieldstrength above a predetermined threshold value, according to the invention is therefore characterised in that said RF input circuit comprises at least one tuneable resonance amplifier being tuned to said RF AM signal, the automatic gain control means controlling said resonance amplifier to increase in both gain and selectivity at a decrease of the fieldstrength of said RF AM signal below said predetermined threshold value.

The invention is based on the recognition that narrowing the bandwidth of the RF AM signal and therewith the audio signal to be reproduced allows for amplification of the selected signal without noticeable increase of noise interferences. From U.S. Pat. No. 5,220,686, being herein incorporated by reference, said tuneable resonance amplifiers are on themselves known for use in the IF part of a receiver for the purpose of amplitude and adaptive noise stabilisation. However, by applying the invention both gain and selectivity of the RF input circuit are simultaneously increased at a decrease of the fieldstrength of said RF AM signal below said predetermined threshold value. Highly annoying noise distortions are therewith suppressed, while maintaining the intelligibility of the perceived audio signal within a range of fieldstrength values substantially larger than that of the above known receiver. This allows to extend the AGC control range at its upper end considerably, i.e. to maintain acceptable signal reproduction for much lower values of the RF signal reception fieldstrength than can be achieved with a conventional AGC.

Preferably, said tuneable resonance amplifier comprises a non-regenerative DC negative feedback loop including first and second gain controlled transconductance amplifiers outputs thereof being coupled via first and second parallel RC filters to inputs of the second and fist gain controlled transconductance amplifiers, respectively, said loop also including means for signal inversion, inputs and outputs of third and fourth gain controlled transconductance amplifiers being coupled to outputs of said first and second gain controlled transconductance amplifiers, respectively, to effectuate a resistance value across said first and second parallel RC filters, respectively, varying with a first control signal supplied by the automatic gain control means to a gain control input of said third and fourth gain controlled transconductance amplifiers.

Said third and fourth gain controlled transconductance amplifiers are known to provide a negative resistance value when being positively fed back and a positive resistance value when being negatively fed back across the first and second parallel RC filters. A variation of this resistance value in accordance with the invention results in a simultaneous variation of both gain and selectivity of said tuneable resonance amplifier requiring only one single control signal therewith allowing for a simple circuit implementation.

Another preferred embodiment of an AM receiver according to the invention is characterised by said automatic gain control means comprising integration means for an integration of said RF carrier dependent DC level, the time constant thereof being chosen to effectuate a high pass filter characteristic for the RF AM signals with said tuneable resonance amplifier.

By applying this measure slowly varying deviations of the DC level from stabilisation level are negatively fed back to the resonance amplifiers, therewith compensating these deviations. This is effective up to a certain variation frequency, defined by the integration constant of the AGC means. The AGC means therewith not only provides for level stabilisation but also for a high pass filtering of the RF AM signal. This prevents the use of separate filtering circuitry.

An agreeable variation of the gain and high pass selectivity as a function of the fieldstrength a preferred embodiment of AM receiver according to the invention is being characterised by a cut off frequency of said high pass filter characteristic varying linearly with the gain of the tuneable resonance amplifier.

For a likewise improvement of the variation of the gain and high pass selectivity as a function of the fieldstrength, another preferred embodiment of AM receiver according to the invention is being characterised by the tuneable resonance amplifier providing a low pass filter characteristic having a cut off frequency decreasing linearly with an increasing gain of the tuneable resonance amplifier and vice versa.

A further preferred embodiment of such AM receiver according to the invention, combining the above fieldstrength determined gain/selectivity variation is characterised by the tuneable resonance amplifier and the automatic gain control means providing a bandpass characteristic, which is logarithmic symmetrical around the tuning frequency of the tuneable resonance amplifier, the bandwidth thereof being in the order of magnitude of at least twice the bandwidth of the audio signal.

An AM receiver according to the invention in a direct receiving concept is characterised by said demodulation means comprising a synchronous demodulator being supplied with an RF tuning oscillator signal for a direct demodulation of said audio signal, said RF tuning oscillator signal being coupled to a gain input of the first and second gain controlled amplifiers. This measure allows accurate parallel tuning between the local oscillator on the one hand and the tuneable resonance amplifier on the other hand.

The invention will be described in greater detail with reference to the Figures shown in the drawing, in which corresponding elements have the same references, which Figures only serve to illustrate the description.

Figure 2:
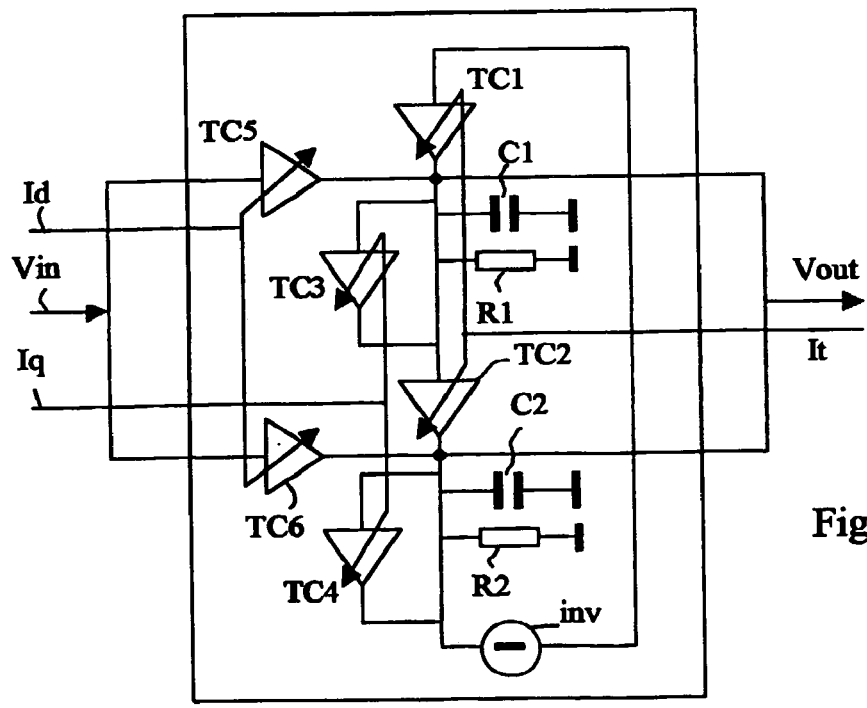
Figure 3:
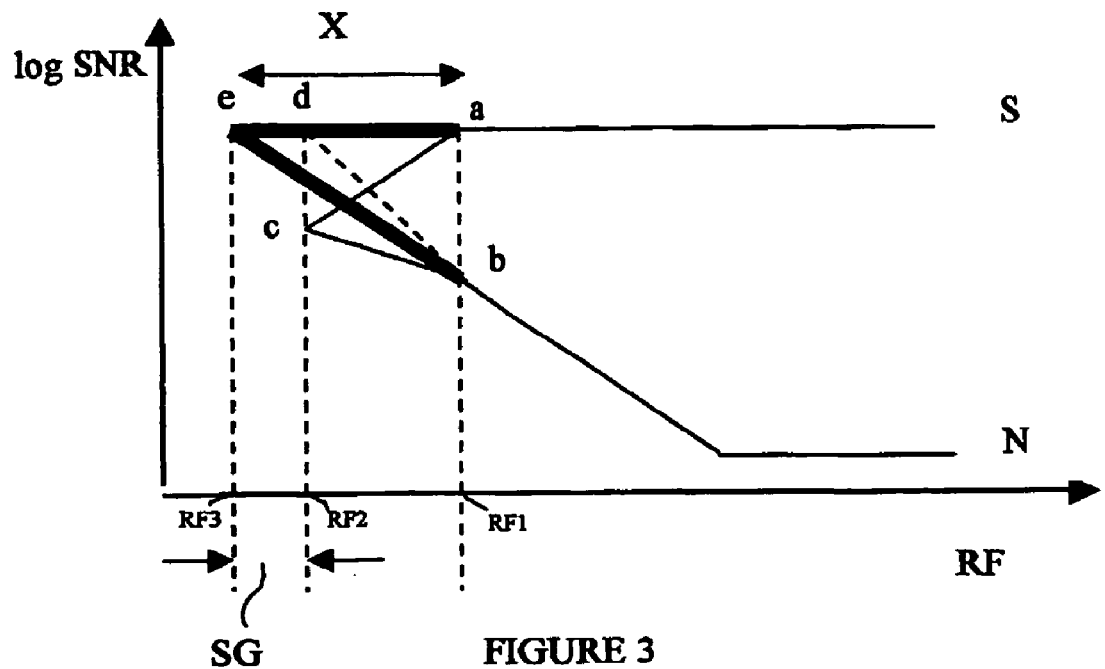
Figure 4:
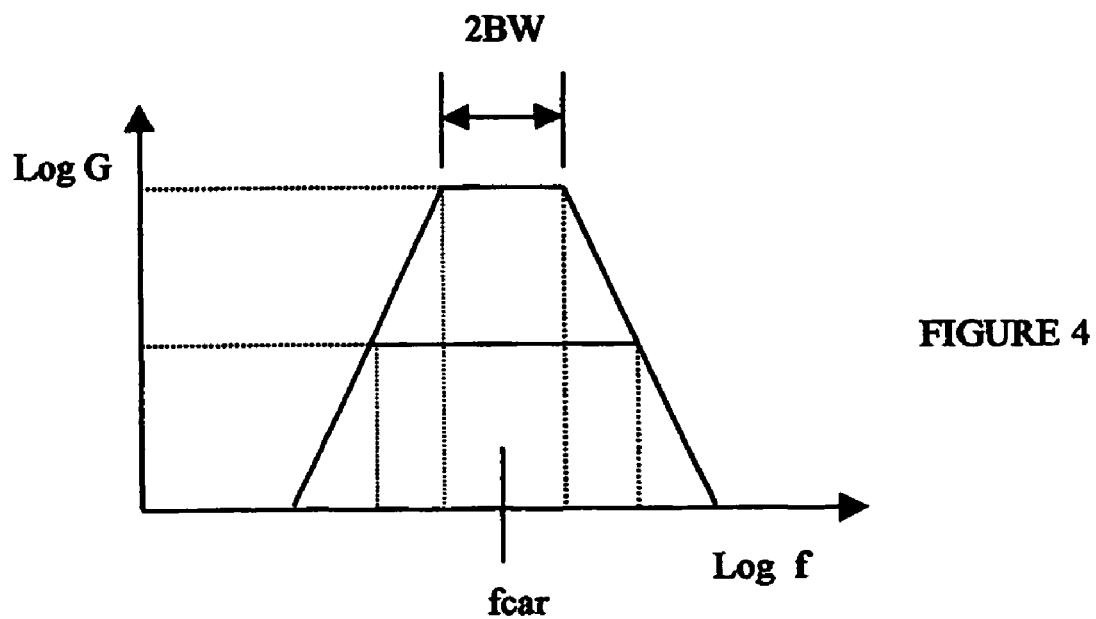

Herein, it is shown in:

FIG. 1, an embodiment of an AM receiver according to the invention;

FIG. 2, an embodiment of a resonance amplifier as used in the AM receiver of FIG. 1;

FIG. 3, a signal plot showing the signal to noise ratio of the demodulated audiosignal of the AM receiver of FIG. 1 as a function of the RF reception fieldstrength;

FIG. 4, a signal plot showing the bandwidth and gain variation of a resonance amplifier with AGC means as shown in FIG. 1.

FIG. 1 shows a preferred embodiment of an AM receiver according to the invention comprising consecutively coupled to antenna means ANT, an RF input circuit RF for receiving and selectively amplifying a wanted RF AM signal, a synchronous demodulator DEM for demodulating said RF AM signal directly into a baseband audio signal, an audio signal processor AP for volume, balance and tone setting of the audio signal and sound reproduction means L. The synchronous demodulator DEM comprises a mixer stage M being provided with a synchronous local oscillator signal from a tuning oscillator OSC. The tuning oscillator OSC is being tuned to the RF carrier frequency of the wanted RF AM signal with a tuning control current It. An output of the synchronous demodulator DEM providing an RF carrier dependent DC level is coupled to automatic gain control means (AGC) means AGC. The RF carrier dependent DC level varies with the RF reception fieldstrength and is being stabilised at a predetermined fixed stabilisation level. The use of such RF carrier dependent DC level for an automatic gain control is on itself known, e.g. from the above Philips' Application Note of Philips' one chip AM radio IC TEA 5551T dated October 1990.

The RF input circuit RF of the AM receiver shown comprises a single tuneable resonance amplifier RS1, which may be part of a cascade of mutually identical tuneable resonance amplifiers RS1-RSn, as indicated in dotted form. Such tuneable resonance amplifier is on itself known, e.g. from FIG. 3 of the above U.S. Pat. No. 5,220,686. For reason of convenience, an illustration of the know resonance amplifier SA is given in FIG. 2 and the circuitry and functionalities thereof will be described hereinafter to the extent necessary to understand the present invention.

The tuneable resonance amplifier RS1 comprises a cascade of first and second gain controlled transconductance amplifiers TC1 and TC2 being included in a non-regenerative DC negative feedback loop. An output of TC2 is therein negatively fed back through an inverter INV to an input of TC1 and outputs of TC1 and TC2 being coupled to respective mass connected parallel RC members R1C1 and R2C2, TC1 and R1C1 respectively TC2 and R2C2 functioning as first and second active poly-phase transconductance filter sections. The common connections of TC1 and R1C1, respectively TC2 and R2C2, constitute quadrature current inputs Iin, respectively I' in and/or quadrature voltage outputs Vout, receptively V' out. The above tuning control current It is being supplied to control terminals of TC1 and TC2 to vary the gain of these transconductance amplifiers TC1 and TC2 and therewith the resonance frequency fres of the tuneable resonance amplifier RS1 to the RF carrier frequency of the wanted RF AM signal. This allows for an accurate parallel tuning of the local oscillator OSC and the tuneable resonance amplifier RS1.

The tuneable resonance amplifier RS1 is also provided with third and fourth controllable transconductance amplifiers TC3 and TC4, each of which is fed back from the output to the input and is arranged at the outputs of TC1 and TC2, respectively. When being positively fed back these transconductance amplifiers TC3 and TC4 provide a negative resistance and when being negatively fed back these transconductance amplifiers TC3 and TC4 provide a positive resististance, which can be considered to be arranged parallel to the parallel RC members R1C1 and R2C2, respectively. Dependent on the gain and selectivity control range wanted and the RC filter characteristics, these transconductance amplifiers TC3 and TC4 can be chosen to simulate positive or negative resistances. Fifth and sixth transconductance amplifiers TC5 and TC6 are included between quadrature voltage inputs Vin and V'in of the tuneable resonance amplifier RS1 on the one hand and the above current inputs Iin and I'in of the tuneable resonance amplifier RS1 on the other hand.

The quadrature voltage inputs Vin and V'in, respectively the quadrature voltage outputs Vout and V'out, are mutually coupled allowing to use the tuneable resonance amplifier RS1 to selectively amplify a single phase RF AM input signal into a singe phase RF AM output signal.

It is known to vary the overall gain of the tuneable resonance amplifier RS1 without affecting its resonance frequency fres and/or bandwidth by varying the gain of the transconductance amplifiers TC5 and TC6. In contrast to this known mode of operation, the invention varies the overall gain of the tuneable resonance amplifier RS1 by a variation of the gain of the third and fourth controllable transconductance amplifiers TC3 and TC4. As stated above, such gain variation also results in a variation of the bandwidth or selectivity of the tuneable resonance amplifier RS1. The invention advantageously makes use of this decrease in bandwidth occurring at an increase in gain, and vice versa, to improve the receiver performance in particular for low values of the RF signal reception fieldstrength as will be explained in more detail hereinafter.

By supplying the above control current Iq in accordance with the invention to control terminals of the third and fourth controllable transconductance amplifiers TC3 and TC4, any decrease of the above RF carrier dependent DC level at the output of said demodulation means below the above stabilisation level causes the gain in the RF input circuit RF to increase and vice versa. This results in the DC level at the DC level output of the demodulating means DEM being stabilised substantially at said stabilisation value.

FIG. 3 illustrates with horizontal line S the stabilising effect of the automatic gain control for variations in the RF reception fieldstrength. The above predetermined threshold value RF1 is chosen to correspond to the upper limit of the gain control range of the AGC of the above conventional receiver marking the reception fieldstrength value above which an acceptable signal (at point a of curve S) to noise (at point b of curve N) ratio in such conventional receiver is obtainedwithout changing the selectivity of the RF input circuit RF. However, as shown with curve N of this FIG. 3, a decrease of the RF reception fieldstrength causes the noise level to increase also for values of the RF reception fieldstrength above said predetermined threshold value RF1. As the signal level remains constant, a decrease in the RF reception fieldstrength causes the signal to noise ratio of the audio signal to reduce. As mentioned above, below said predetermined threshold value RF1 of the RF reception fieldstrength, the AGC of the known receiver would reach its upper gain range limit reflected in the RF carrier dependent DC level deviating downwards from the stabilisation level as RF reception fieldstrength further decreases as illustrated with curve a-c. Along therewith the noise level increases as illustrated by curve b-c, resulting in the signal to noise ratio of the known receiver to strongly decrease down to zero value at an RF fieldstrength value RF2 in point c. An increase of the gain of the known receiver such that the above mentioned RF carrier dependent DC level is stabilised at the stabilisation level (curve S) for an RF fieldstrength below said predetermined threshold value RF1 would effectuate an unacceptable increase of the noise level as indicated with dotted curve b-d. The signal to noise ratio decreases with decreasing RF fieldstrength down to zero value at point d.

In contrast therewith, in the receiver according to the invention, for an RF reception fieldstrength decreasing below said predetermined threshold value RF1, the, selectively of the tuneable resonance amplifier RS1 is effectively increased therewith narrowing the bandwidth of the audio signal passing through to the demodulation means DEM. Simultaneously the gain of the tuneable resonance amplifier RS1 is increased to keep the above mentioned RF carrier dependent DC level stabilised at the stabilisation level (curve S). Although along therewith also the signal to noise ratio decreases (see the decreasing distance between the bold lines a-c of curve S and b-c of curve N at an RF reception fieldstrength decreasing below RF1), this decrease is much smaller than the signal to noise ratio decrease occurring at a corresponding decrease of the RE reception fieldstrength in the above conventional receiver (see the decreasing distance between the lines a-c of curve S and b-c of curve N for an RF reception fieldstrength decreasing below RF1), causing the signal to noise ratio to decrease with decreasing RE fieldstrength down to zero value at point e. Furthermore, the simultaneous increase in both gain and selectivity according to the invention effectively suppresses highly annoying noise distortions, while maintaining the intelligibility of the perceived audio signal within this range of RF reception fieldstrength values substantially larger than that of the above known receiver. Compared with the AGC applied in the above conventional receiver, these measures allow to increase the gain of the RF input circuit at RF reception fieldstrength values decreasing below the predetermined threshold value RF1, to effectively continue to stabilise the RF carrier dependent DC level at said predetermined fixed stabilisation level S and to therewith extend in FIG. 3, the stabilisation range S along the bold horizontal line with a range X. This results in an extension of the range of RF reception fieldstrength values offering acceptable signal reproduction with a range indicated in FIG. 3 with SG i.e. the distance between point d and e. The receiver is therefore able to receive and reproduce much weaker RF reception signals than conventional receiver, such as the abovementioned one chip AM radio IC TEA 5551T. The gain increase also somewhat amplifies the noise level as indicated with the bold line be continuing upon line N in FIG. 3, however, compared with receivers using a conventional AGC the net result of both gain and selectivity increase is an increase in the perceptual signal to noise ratio of the audio signal reflected in the distance between the bold lines a-e of curve S and b-e of curve N.

FIG. 4 shows a signal plot showing the bandpass characteristic of a resonance amplifier provided with AGC means as used in the AM receiver shown in FIG. 1 allowing for an agreeable variation of the gain and selectivity as a function of the fieldstrength. By including integration means for an integration of said RF carrier dependent DC level in the AGC means, variations in the DC level of the audio signal up to a certain variation frequency, are negatively fed back to the tuneable resonance amplifier RS1 and therewith compensated. This results in a high pass signal selectivity. By an appropriate choice of the integration time constant of said integration means, a high pass filter characteristic for the RF AM signals in said tuneable resonance amplifier is obtained having a cut off frequency varying linearly with the gain of the tuneable resonance amplifier RS1, as shown in this FIG. 4.

Apart therefrom, by proper design the tuneable resonance amplifier RS1 provides a low pass filter characteristic having a cut off frequency decreasing linearly with an increasing gain of the tuneable resonance amplifier and vice versa. The overall effect of these design choices is a bandpass characteristic, which is logarithmic symmetrical around the tuning frequency of the tuneable resonance amplifier. In order not to lose useful signal components, said bandwidth is chosen in the order of magnitude of at least twice the bandwidth of the audio signal within the stabilisation range of the receiver AGC and decreases for values of the RF fieldstrength below the value RF1 down to 1 kHz.

Various alternative embodiments of the invention could be feasible, such as those using a superhet receiver concept and/or using a cascade of multiple tuneable resonance amplifiers in the RF input circuit RF. Generally, the scope of the present invention should be recognized from the appended set of claims, the disclosure being by way of example, rather than being restrictive.

The invention claimed is:

1. An AM receiver comprising:
    an RF input circuit that is configured to receive an RF AM signal,
    a demodulator that is configured to provide an audio signal carried by the RF AM signal,
    an automatic gain controller that is configured to stabilize an RF carrier dependent DC level at the output of the demodulator at a substantially fixed stabilization value for RF AM signals having an RF reception fieldstrength above a predetermined threshold value,
    wherein:
    the RF input circuit comprises at least one tuneable resonance amplifier that is tuned to the RF AM signal,
    the automatic gain controller controls the resonance amplifier to increase in both gain and selectivity at a decrease of the fieldstrength of the RF AM signal below the predetermined threshold value, and
    the automatic gain controller comprises
        a comparator, and
        an integrator that provides an integration of the difference between the RF carrier dependent DC level and a predetermined set level, and a time constant of the integrator is chosen to effectuate a high pass filter characteristic for the RF AM signals In the tuneable resonance amplifier.

2. AM receiver according to claim 1, wherein
a cut off frequency of the high pass filter characteristic on a logarithmic scale varies linearly with the gain of the tuneable resonance amplifier.

3. AM receiver according to claim 2, wherein
the tuneable resonance amplifier and the automatic gain controller provides a bandpass characteristic, which is symmetrical around the tuning frequency of the tuneable resonance amplifier, and
a bandwidth of the tuneable resonance amplifier is in an order of magnitude of at least twice a bandwidth of an audio signal for a signal to noise ratio of the audio signal greater than 20 dB.

4. AM receiver according to claim 3, wherein
the tuneable resonance amplifier and the automatic gain controller provides a bandpass characteristic having a minimum bandwidth of 1 kHz.

5. An AM receiver comprising:
an RF input circuit that is configured to receive an RF AM signal,
a demodulator that is configured to provide an audio signal carried by the RF AM signal, and
an automatic gain controller that is configured to stabilize an RF carrier dependent DC level at the output of the demodulator at a substantially fixed stabilization value for RF AM signals having an RF reception fieldstrength above a predetermined threshold value,
wherein:
the RF input circuit comprises at least one tuneable resonance amplifier that is tuned to the RF AM signal,
the automatic gain controller controls the resonance amplifier to increase in both gain and selectivity at a decrease of the fieldstrength of the RF AM signal below the predetermined threshold value,
the tuneable resonance amplifier comprises:
a non-regenerative DC negative feedback loop that includes
first and second gain controlled transconductance amplifiers, outputs thereof being coupled via first and second parallel RC filters to inputs of the second and first gain controlled transconductance amplifiers, respectively, and
an inverter, and
third and fourth gain controlled transconductance amplifiers having inputs and outputs that are coupled to outputs of the first and second gain controlled transconductance amplifiers, respectively, to effectuate a resistance value across the first and second parallel RC filters, respectively, varying with a first control signal supplied by the automatic gain controller to a gain control input of the third and fourth gain controlled transconductance amplifiers, and
the automatic gain controller comprises
a comparator, and
an integrator that provides an integration of the difference between the RF carrier dependent DC level and a predetermined set level, and
a time constant of the integrator is chosen to effectuate a high pass filter characteristic for the RF AM signals in the tuneable resonance amplifier.

6. AM receiver according to claim 5, wherein
a cut off frequency of the high pass filter characteristic on a logarithmic scale varies linearly with the gain of the tuneable resonance amplifier.

7. AM receiver according to claim 1, wherein
the tuneable resonance amplifier provides a low pass filter characteristic having a cut off frequency on a logarithmic scale decreasing linearly with an increasing gain of the tuneable resonance amplifier and vice versa.

8. AM receiver according to claim 3, wherein
the tuneable resonance amplifier provides a low pass filter characteristic having a cut off frequency on a logarithmic scale decreasing linearly with an increasing gain of the tuneable resonance amplifier and vice versa.

9. AM receiver according to claim 2, wherein
the tuneable resonance amplifier provides a low pass filter characteristic having a cut off frequency on a logarithmic scale decreasing linearly with an increasing gain of the tuneable resonance amplifier and vice versa.

10. AM receiver according to claim 5, wherein
the tuneable resonance amplifier provides a low pass filter characteristic having a cut off frequency on a logarithmic scale decreasing linearly with an increasing gain of the tuneable resonance amplifier and vice versa.

11. AM receiver according to claim 6, wherein
the tuneable resonance amplifier provides a low pass filter characteristic having a cut off frequency on a logarithmic scale decreasing linearly with an increasing gain of the tuneable resonance amplifier and vice versa.

12. AM receiver according to claim 5, wherein
the tuneable resonance amplifier and the automatic gain controller provides a bandpass characteristic, which is symmetrical around the tuning frequency of the tuneable resonance amplifier, and
a bandwidth of the tuneable resonance amplifier is in an order of magnitude of at least twice a bandwidth of an audio signal for a signal to noise ratio of the audio signal greater than 20 dB.

13. AM receiver according to claim 6, wherein
the tuneable resonance amplifier and the automatic gain controller provides a bandpass characteristic, which is symmetrical around the tuning frequency of the tuneable resonance amplifier, and
a bandwidth of the tuneable resonance amplifier is in an order of magnitude of at least twice a bandwidth of an audio signal for a signal to noise ratio of the audio signal greater than 20 dB.

14. AM receiver according to claim 11, wherein
the tuneable resonance amplifier and the automatic gain controller provides a band pass characteristic having a minimum bandwidth of 1 kHz.

15. AM receiver according to claim 12, wherein
the tuneable resonance amplifier and the automatic gain controller provides a bandpass characteristic having a minimum bandwidth of 1 kHz.

16. AM receiver according to claim 13, wherein
the tuneable resonance amplifier and the automatic gain controller provides a bandpass characteristic having a minimum bandwidth of 1 kHz.

* * * * *